United States Patent [19]
Fleming et al.

[11] Patent Number: 5,977,582
[45] Date of Patent: Nov. 2, 1999

[54] CAPACITOR COMPRISING IMPROVED TAO$_X$-BASED DIELECTRIC

[75] Inventors: Robert McLemore Fleming, Chatham; Lynn Frances Schneemeyer, Westfield; Robert Bruce van Dover, Maplewood, all of N.J.

[73] Assignee: Lucent Technologies Inc., Murray Hill, N.J.

[21] Appl. No.: 08/862,907

[22] Filed: May 23, 1997

[51] Int. Cl.$^6$ ............................ H01L 27/10; H01L 27/04; H01L 29/78

[52] U.S. Cl. ............................ 257/310; 257/300; 257/309; 257/532

[58] Field of Search ............................ 438/240; 257/532, 257/310, 296, 300, 309, FOR 310, FOR 532; 148/DIG. 14

[56] References Cited

U.S. PATENT DOCUMENTS

| | | | |
|---|---|---|---|
| 3,949,275 | 4/1976 | Muenz | 361/766 |
| 4,038,167 | 7/1977 | Young | 204/192 D |
| 4,200,502 | 4/1980 | Munz et al. | 205/125 |
| 4,471,405 | 9/1984 | Howard et al. | 257/535 |
| 4,743,953 | 5/1988 | Toyodura et al. | 257/310 |
| 4,969,032 | 11/1990 | Scheitlin et al. | 257/532 |
| 5,248,629 | 9/1993 | Muroyama | 437/52 |
| 5,479,316 | 12/1995 | Smrtic et al. | 257/532 |
| 5,742,126 | 4/1998 | Fujii et al. | 313/635 |

FOREIGN PATENT DOCUMENTS

| | | | |
|---|---|---|---|
| 57-50466 | 3/1992 | Japan | 257/310 |

OTHER PUBLICATIONS

P.K. Reddy et al. "Ta–Al–N Thin Film Resistor With Improved Electrical Properties", Thin Solid Films, 70, pp. 27–35, Jan. 7, 1980.
P.K. Reddy et al. "Improved Properties Of TaN–Ta2O5Nx–Al Capacitors", Thin Solid Films, 64, pp. 71–76, Apr. 23, 1979.
P.K. Reddy et al. "Temperature–Compensated RC Networks Developed Using Ta–Al–N Films", Thin Solid Films, 96, pp. 271–277, Apr. 4, 1982.
P.K. Reddy et al. "Properties Of Thin Film Capacitors Made With Reactively Sputtered Ta–Al", Thin Solid Films, 72, pp. 443–448, Apr. 21, 1980.
Tiku et al., "Dielectrics for Bright EL Displays", IEEE Transactions on Electron Devices, vol. 36. No. 9, pp. 1947–1952, Sep. 1989.
Reddy, et al., Thin Solid Films, Electronics and Optics, "High Frequency Performance of Ta–Al–N Capacitors Made With an Aluminum Underlayer", vol. 109, pp. 339–343, 1983.
Patent Abstracts of Japan, vol. 010, No. 359 (E–460), Dec. 3, 1986 and JP 61 156865 A(NEC Corp.), Jul. 16, 1986.
Patent Abstracts of Japan, vol. 009, No. 147 (E–323), Jun. 21, 1985 and JP 60 028259 A (Nippon Denki KK), Feb. 13, 1985.
"Effects of Additive Elements on Electrical Properties of Tantalum Oxide Films", by H. Fujikawa, *J. Appl. Phys.*, vol. 75 (5), Mar. 1, 1994, p. 2538.
"Electrical Properties of Al$_2$O$_3$–Ta$_2$O$_5$ Composite Dielectric Thin Films Prepared by RF Reactive Sputtering", by K. Nomura, *J. Electrochemical Soc.*, vol. 134, p. 924 (1987).
"Photoconductivity in Anodic Ta$_2$O$_5$ Formed on Nitrogen-doped Tantalum Films", by J.H. Thomas III, *Journal of Applied Physics*, vol. 45, No. 12, Dec. 1974, p. 5349.

*Primary Examiner*—Teresa M. Arroyo
*Assistant Examiner*—Maria Guerrero
*Attorney, Agent, or Firm*—Eugen E. Pacher

[57] ABSTRACT

A dielectric layer consisting essentially of Ta, Al, oxygen and nitrogen can have advantageous properties that make such a layer useful for thin film capacitors, typically capacitors for Si integrated circuits. For instance, a significantly greater fraction of capacitors according to the invention than of prior art tantalum oxide capacitors can store a charge of 3 $\mu$coulomb/cm$^2$. In a currently preferred embodiment, the dielectric layer has composition Ta$_{1-y}$Al$_y$O$_x$N$_z$, with y~0.1, x~2.4, and z~0.02. The dielectric layer can be formed by sputter deposition or any other appropriate deposition technique, e.g., chemical vapor deposition.

6 Claims, 4 Drawing Sheets

CAPACITOR COMPRISING IMPROVED $TaO_x$-BASED DIELECTRIC

FIELD OF THE INVENTION

This application pertains to $TaO_x$-based dielectrics, typically to such dielectrics for integrated circuits (ICs).

BACKGROUND

The relatively high dielectric constant and breakdown field strength of tantalum oxide (herein generally $TaO_x$, x~2.5) make thin film $TaO_x$ potentially useful for integrated circuit applications. However, before $TaO_x$-based dielectric material can be used in production devices, some properties of the material have to be improved. Among these are leakage current which, at least for some IC applications, desirably is reduced over typical prior art values, and breakdown voltage, which desirably is raised.

Two approaches have dominated the efforts to improve the dielectric properties, namely, post-deposition annealing, and incorporation of one or more further metal oxides such as $Al_2O_3$, $TiO_2$, $WO_3$, $SiO_2$ or $ZrO_2$ into the film. The former requires relatively high temperatures, and may lead to crystallization of the $TaO_x$, a deleterious change. In any case, post-deposition annealing to date has yielded only marginal improvements in leakage current and breakdown voltage.

The latter approach to date also has not yielded the desired improvements in dielectric properties.

Representative of prior efforts are H. Fujikawa et al., *J. Applied Physics*, Vol. 75 (5), p. 2538 (1994), and K. Nomura et al., *J. Electrochemical Soc.*, Vol. 134, p. 924 (1987). The former reports magnetron sputter deposition of $Ta_2O_5$ plus 2 other oxides (e.g., $Al_2O_3+ZrO_2$) in $Ar+O_2$. The latter reports RF sputter deposition of $TaO_x+Al_2O_3$ in $Ar+O_2$.

See also J. H. Thomas, *J. Applied Physics*, Vol. 45 (12), p. 5349 (1974), which reports results on the study of defects in anodic $Ta_2O_5$ formed on $N_2$-doped Ta films. U.S. Pat. No. 4,038,167 discloses formation of a thin film capacitor by a method that comprises RF sputtering a film of Ta oxide in an $O_2$—$N_2$ inert gas atmosphere.

In view of the high dielectric constant and other advantageous properties of $TaO_x$, it would be desirable to have available a $TaO_x$-based dielectric film that can have relatively low leakage current and relatively high breakdown voltage. This application discloses such a film, and a method of making the film.

SUMMARY OF THE INVENTION

We have made the unexpected discovery that addition of both aluminum and nitrogen to Ta-oxide films can significantly improve the dielectric properties of the films. Exemplarily, substitution of about 5–40 atomic % Al for Ta, and of about 10–25 volume % of $N_2$ for $O_2$ in the sputtering gas can substantially improve the dielectric properties, resulting in high and statistically more uniform breakdown voltage, and in low leakage current.

DETAILED DESCRIPTION

Figure 1:
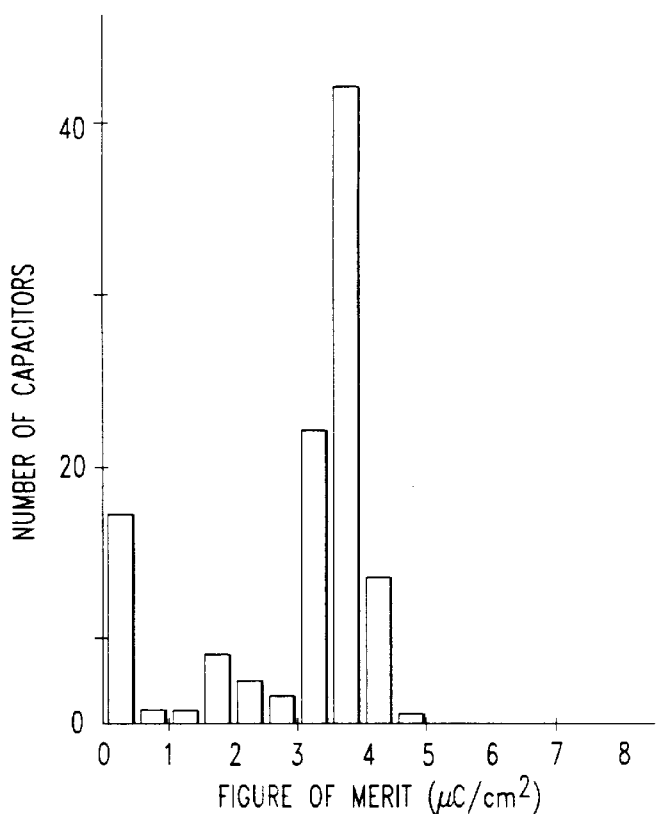
FIGS. 1–3 are histograms of results obtained from prior art materials.

In order to make a meaningful comparison of the dielectric properties of dielectric films of different compositions, possibly differently prepared, it is necessary to select a meaningful figure of merit. For instance, there generally exists fairly wide design flexibility to vary the thickness of the dielectric film in capacitors used in IC applications. Thus, neither the dielectric constant (e) nor the breakdown field ($E_{br}$) is an independent figure of merit. Instead, the most relevant figure of merit is the product $\epsilon E_{br} = CV_{br}/A$, where C is the measured capacitance, $V_{br}$ is the measured breakdown voltage, and A is the known area of the capacitor.

Those skilled in the art will recognize that $CV_{br}/A$ corresponds to the maximum charge that can be stored on the capacitor. Herein the value of $V_{br}$ is determined by passing a DC current (e.g., 10 nA) for maximally 10s through the capacitor and measuring the voltage developed across the capacitor. The maximum voltage developed (herein designated $V^*$) is used as an estimate of $V_{br}$. For some capacitors this may be a significant underestimate of the true catastrophic breakdown voltage, but for typical capacitors it is a good estimate. It will be noted that the figure of merit $CV^*/A$ is independent of the thickness of the dielectric layer as long as $\epsilon$ and $E_{br}$ are independent of thickness. The value of $V^*$ typically depends on the polarity of the measurement current. Herein the polarity is selected such that electrons are injected into the dielectric film from a Hg probe electrode.

Prior art results typically are reported in terms of properties of single capacitors. This may cause misleading conclusions. For instance, a particular change in composition might improve the properties of the best capacitors, and yet degrade the properties of most of the capacitors. To avoid such potential problems we have evaluated our data statistically, with histograms showing the relative probability of obtaining a particular capacitance range. These histograms can be characterized by two independent parameters. One of these is $Y_{3.0}$=(number of capacitors with $CV^*/A>3.0$ $\mu$coulomb/cm$^2$) divided by (total number of capacitors). $Y_{3.0}$ thus is the yield of "good" capacitors. The other parameter, denoted $M_{3.0}$, is the median of the data points above a specified cut-off, namely, 3.0 $\mu$coulomb/cm$^2$.

Dielectric films were deposited by a known method, off-axis reactive co-sputtering, in a commercially available apparatus. However, it is expected that other appropriate deposition techniques (e.g., on-axis reactive sputtering with a composite target, chemical vapor deposition, etc.) will yield comparable results.

The Ta gun was typically run at 100 W, while the power to the Al gun was varied to provide an appropriate Al/Ta ratio at the substrate midpoint. Typical deposition parameters are listed in Table I. Exemplarily the depositions were performed at a total pressure of 30 mT (4 Pa), using flow rates of 40, 10 and 2.5 sccm for Ar, $O_2$ and $N_2$, respectively. For off-axis sputtering, we have applied a RF bias directly to the sample holder. A power of 10 W was found to give good results on a 60 cm$^2$ sample holder.

TABLE I

| Material | RF Power (W) | Bias Voltage ($V_{dc}$) | Deposition Rate (ng-cm$^{-2}$-s$^{-1}$) |
|---|---|---|---|
| (Substrate Bias) | 10 | −120 | — |
| Ta—O | 100 | −330 | 25 |
| Ta—O—N | 100 | −330 | 26 |
| Al—O | 40 | −215 | .9 |
| Al—O—N | 40 | −207 | .9 |

The substrates were conventional Si wafers with 550 nm of thermal oxide, coated with 45 nm of Ti and 60 nm of TiN. The substrate temperature typically did not rise above 50° C. during a typical 20 minute deposition run. Dielectric films according to the invention have composition $Ta_{1-y}Al_yO_xN_z$, possibly with a trace amount of Ar as an unintended impurity.

Film thickness and cation composition as a function of position on the wafer were determined by conventional techniques, including Rutherford Backscattering. The cation composition parameter y typically is in the range 0.05–0.5, with values below the lower limit typically not giving significant improvement in the dielectric properties, and values above the upper limit significantly reducing the figure of merit, as the lower dielectric constant of $AlO_x$, begins to dominate without compensating increase in $E_{br}$.

The anion composition parameter x typically is less than about 2.5 (typically about 2.35), and the parameter z typically is in the range 0.01–0.1, with x+z typically being about 2.4, to within about 10%.

The dielectric properties of the films were evaluated using a scanning Hg-probe. The circular contact area had 0.9 mm diameter, corresponding to a capacitor area $A=6.3 \times 10^{-3}$ cm$^2$. The capacitance of the capacitor defined by the Hg-probe was measured with a commercially available LCR meter at 10 kHz and a signal level of 1 Vac. V* was determined with a commercially available current source and electrometer. Measurements were typically made at 750 points on 1 mm centers in a 15×50 mm rectangle. Table II shows exemplary data for comparison films (Ta-oxide film prepared using commercially available on-axis sputtering equipment, Ta-oxide film prepared using off-axis sputtering equipment, Ta—Al-oxide film, and Ta—O—N film), as well as for Ta—Al—O—N film according to the invention. The unexpected improvement in the dielectric properties of the film according to the invention over the comparison films is evident from the data of Table II. The figure of merit ($Y_{3.0}$) of a multi-capacitor sample of capacitors with dielectric according to the invention typically substantially exceeds that of a comparison sample of capacitors with the prior art dielectric tantalum oxide. Typically $Y_{3.0}$ of the former will be at least 75%, preferably more than 80%.

TABLE II

| Material | # Capacitors Measured | $Y_{3.0}$ | $M_{3.0}$ ($\mu C/cm^2$) |
|---|---|---|---|
| Ta—O (CVC Standard Film) | 100 | 74% | 3.9 |
| Ta—O | 750 | 66% | 4.5 |
| Ta—Al—O | 750 | 27% | 5.8 |
| Ta—O—N | 750 | 61% | 4.8 |
| Ta—Al—O—N | 750 | 88% | 5.9 |

FIG. 1 shows the data corresponding to the first line of Table II. Clearly, most of the capacitors had CV*/A~4 $\mu$coulomb/cm$^2$. The Ta—O capacitors were prepared using a commercial apparatus (CVC, Inc., of Rochester, N.Y.) using on-axis sputtering, a standard process for depositing thin film $TaO_x$ capacitors, and the results demonstrate the typical quality obtained. The data of FIG. 1 is presented as a benchmark against which the dielectric layers according to the invention can be compared.

Figure 2:
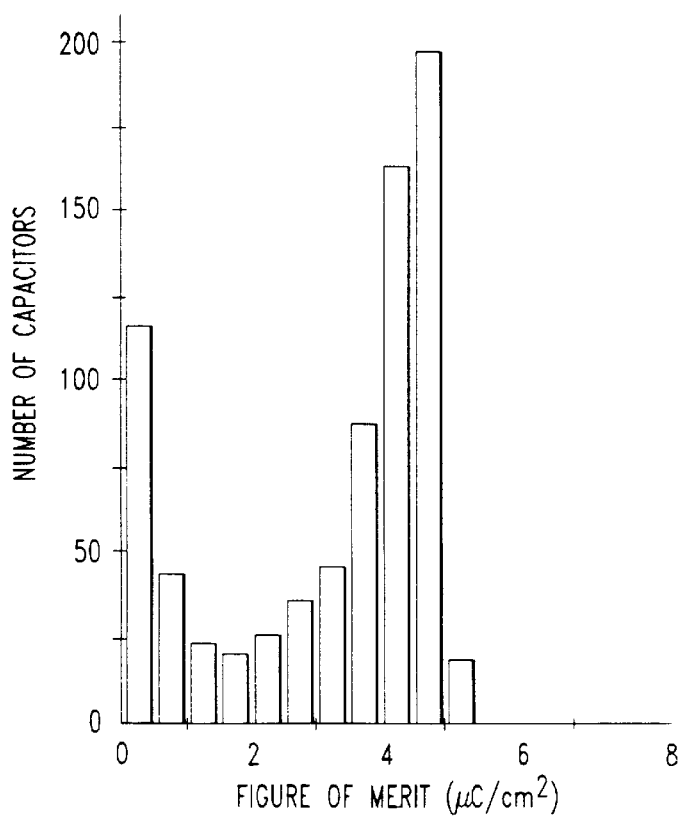

FIG. 2 shows the data corresponding to line 2 of Table II, namely a $TaO_x$ film grown by off-axis sputtering in our deposition apparatus. The film has a slightly lower value of $Y_{3.0}$ and a slightly higher value of $M_{3.0}$ than the benchmark film of FIG. 1. The lower value of $Y_{3.0}$ can be attributed at least in part to an edge effect and thus is not inherent. Indeed, we conclude that the off-axis film of FIG. 2 is of quality comparable to that of the benchmark film.

Figure 3:
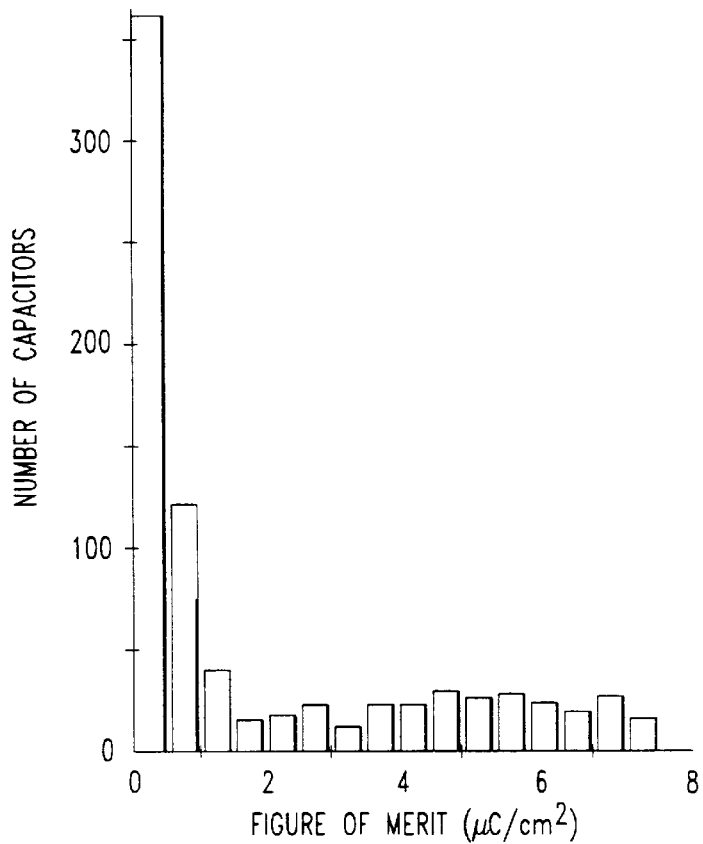

FIG. 3 shows measurement results on $Ta_{1-y}Al_yO_x$ films produced by off-axis co-sputtering of Ta and Al in Ar and $O_2$. It has been reported (e.g., K. Nomura et al., op. cit.) that the addition of Al to $TaO_x$ results in improved breakdown voltage, and thus in improved CV*/A. Although our results show some capacitors with improved figure of merit, up to a value of 8.0 $\mu$coulomb/cm$^2$, the yield of good capacitors ($Y_{3.0}$) of the Al-doped capacitors is much less than for the benchmark film. Inspection of the data as a function of Al content indicates that this result is consistent over the range $0.05<y<0.5$ in $Ta_{1-y}Al_yO_x$.

Figure 4:
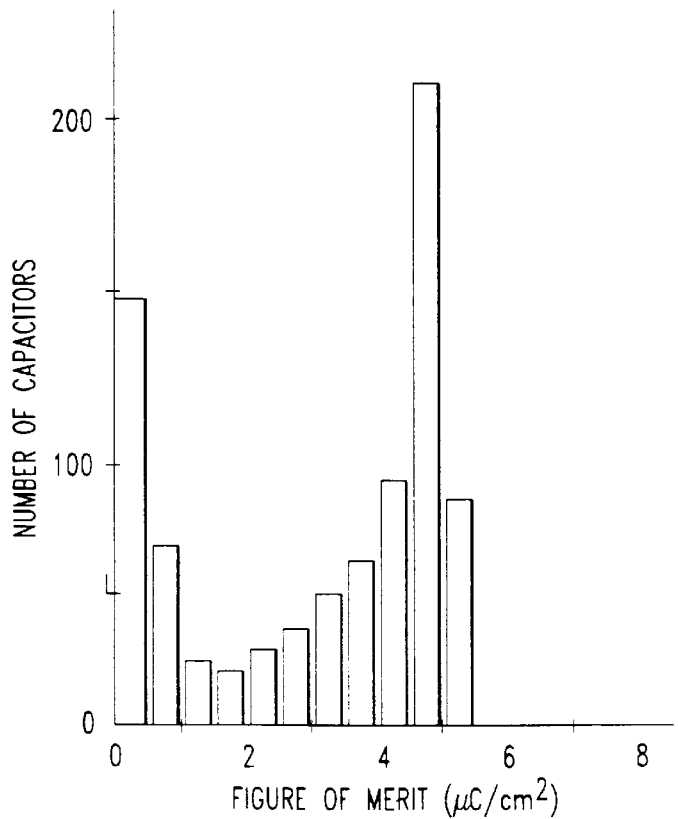
FIG. 4 shows a histogram of results obtained from Ta-oxynitride.

FIG. 4 shows measurement results on $TaO_xN_z$ dielectric film, produced by off-axis sputtering as described above, i.e., by adding 5 vol. % $N_2$ to the Ar/$O_2$ mix. As can be seen from FIG. 4, doping of $TaO_x$ with nitrogen does not significantly improve the dielectric properties of the films, as compared to the benchmark film. There is an increase in the fraction of capacitors with the highest figure of merit, but there is also a decrease in the yield $Y_{3.0}$ of "good" capacitors.

Figure 5:
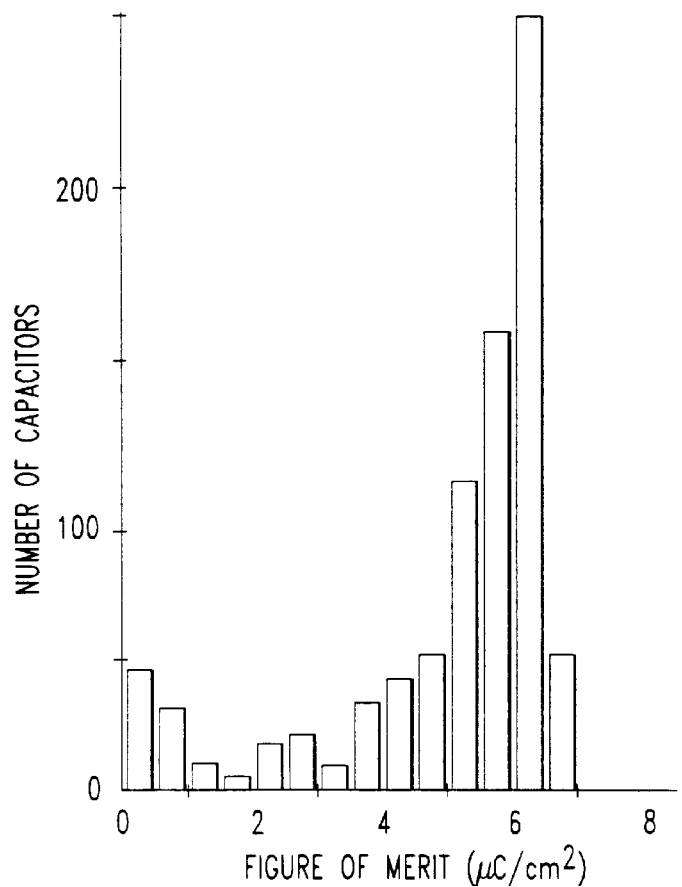
FIG. 5 shows a histogram of results obtained from exemplary material according to the invention.

The results are dramatically different for aluminum and nitrogen-doped Ta-oxide ($Ta_{1-y}Al_yO_xN_z$) as can be readily seen from FIG. 5. Both $Y_{3.0}$ and $M_{3.0}$ are significantly improved over their values in the benchmark film or in the Ta-oxide based films prepared with only one of Al and $N_2$ as substituent. These results reveal a synergistic effect that goes considerably beyond a mere addition of the effects of partial Al-substitution and $N_2$-addition. Indeed, the results of Al- and $N_2$-substitution can not be predicted from existing theory or from a knowledge of the effects of separate Al substitution and $N_2$ substitution.

Examination of the raw data indicates that $Y_{3.0}$ begins to drop at y~0.4, indicating an upper limit for the beneficial effect of Al substitution. This upper limit is expected to depend at least to some extent on z, the fraction of nitrogen in the film. However, we currently believe that y~0.5 is a realistic upper limit on the Al-content. Measurements on a $Ta_{1-y}Al_yO_xN_z$ film with higher Al content were consistent with the above discussed conclusions, showing monotonically decreasing values of CV*/A as y increases beyond ~0.4.

Figure 6:
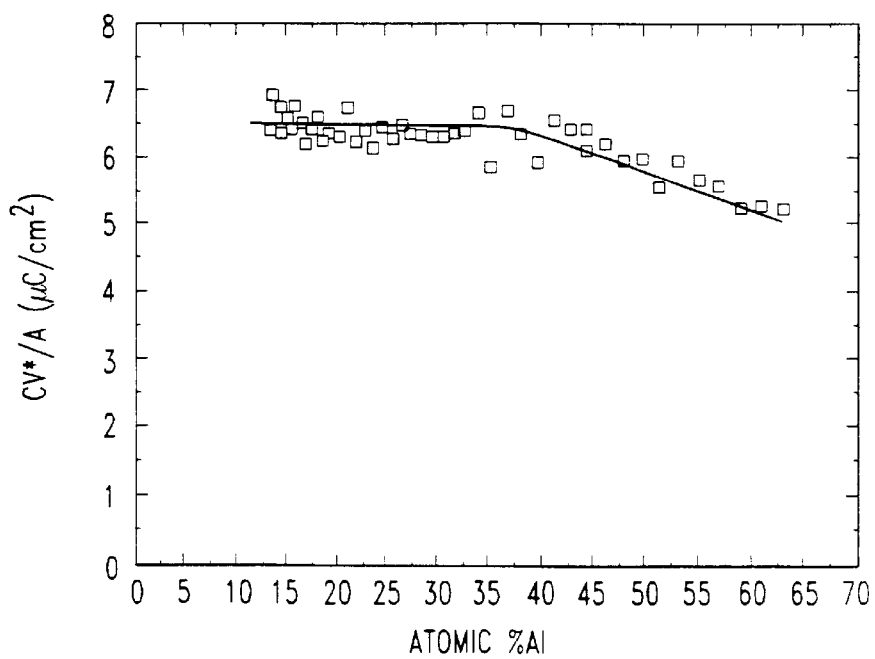
FIG. 6 shows exemplary data on the figure of merit of material according to the invention as a function Al content.

FIG. 6 shows CV*/A as a function of the Al-content for dielectric films according to the invention. The data reveals the decrease in the figure of merit for y>0.4.

Figure 7:
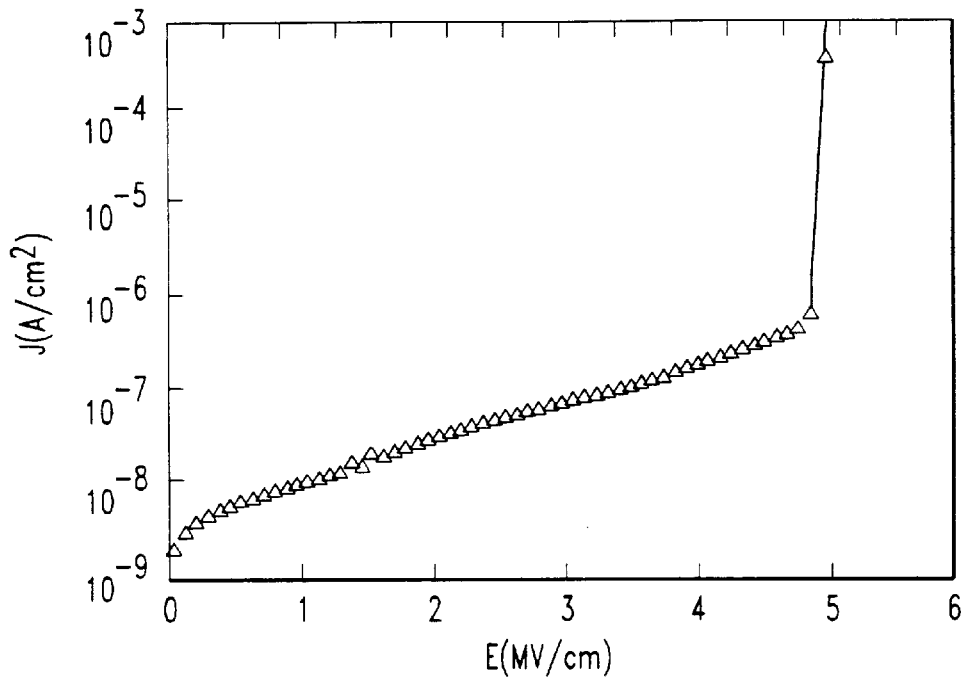
FIG. 7 shows current density as a function of applied field for an exemplary material according to the invention.

FIG. 7 shows current density vs. applied field for one of the best dielectric films according to the invention produced by us to date. The film exhibits low leakage current below breakdown and a breakdown field equal, to the best of our knowledge, to the best value reported in the literature. Since our films according to the invention were produced in an ordinary laboratory environment (i.e., not a dust-free clean room) by a non-optimized process, the existence of a film such as that of FIG. 7 suggests that further improvements may be attainable. For instance, deposition at an elevated temperature (e.g., in the range 100–400° C.) may have beneficial results. Indeed, we expect that $Y_{3.0}>88\%$ will be attainable.

Although Al may not be the only cation substituent that can provide improved dielectric properties, to date we have not found any other beneficial cation substituent. Specifically, additions of 5–50 at % of Si, Ge, Sn or Ti, each with and without $N_2$ in the sputtering atmosphere, either had not effect or decreased $Y_{3.0}$.

Figure 8:
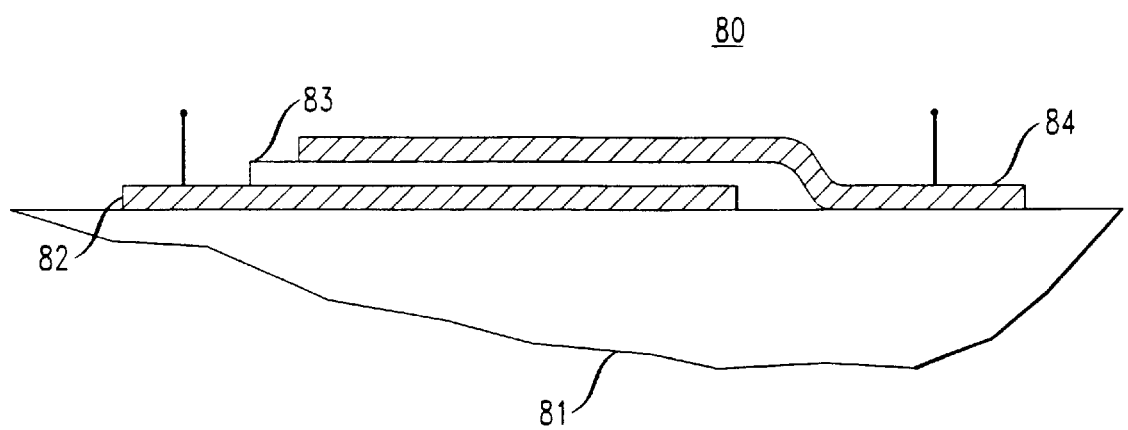
FIG. 8 schematically depicts an article according to the invention, namely, a capacitor that comprises dielectric material according to the invention.

FIG. 8 schematically depicts a capacitor 80 according to the invention on a substrate 81 (exemplarily a Si chip). The capacitor comprises electrodes 82 and 84, with a dielectric layer 83 according to the invention therebetween. Typically the capacitor will be part of an integrated circuit. Such a circuit can be conventional and does not require detailed description.

Those skilled in the art will appreciate that dielectric layer 83 is not necessarily of constant composition throughout the layer thickness. Indeed, in some embodiments capacitors according to the invention will have a compound dielectric layer, exemplarily comprising alternating layers of material according to the invention and another dielectric material (e.g., $Al_2O_3$), or comprising a layer of material according to the invention, either sandwiched between two layers of another dielectric material (e.g., $Al_2O_3$), or sandwiched between one layer of another dielectric material and one of the conductor layers.

Example 1. Material according to the invention was produced by off-axis co-sputtering deposition as follows. A conventional Si substrate with 60 nm TiN was provided and mounted onto the aluminum sample holder of the sputtering apparatus such that the sample was positioned 3.0 cm from the Ta-metal magnetron sputter gun target, and 8.0 cm from the Al-metal magnetron sputter gun target. The two sputter guns were positioned with targets facing each other. The sample was positioned such that its plane is parallel to the line connecting the centers of the two targets, and displaced 3.5 cm from that line. After mounting of the substrate, the system was evacuated to less than $5\times10^{-6}$ Torr, followed by establishing flows of 2.5 sccm $N_2$, 10 sccm $O_2$, and 40 sccm Ar. The high vacuum pump was throttled to obtain a total gas pressure of 30.0 mTorr. 10 W of rf power were applied to the substrate, and 100 W and 40 W of rf power were applied to the Ta gun and the Al gun, respectively. The matching circuits were tuned to respectively obtain minimum reflected power. Maintaining these conditions for 20 minutes resulted in deposition of a Ta—Al-oxygen-nitrogen film of thickness and composition that depends on position on the substrate.

After removal of the substrate with the dielectric layer thereon from the deposition chambers, capacitance measurements were made substantially as described above. The measurements yielded figure of merit data substantially as shown in FIG. 5.

Example 2. Material according to the invention was produced by on-axis sputter deposition as follows. A substrate was provided as in Example 1. A $Ta_{0.9}Al_{0.1}$ composite 2 inch diameter sputtering target was mounted in the magnetron sputtering gun. The substrate was mounted onto the sample holder/heater with Ta clips such that the substrate faced the sputtering target and was spaced 9.0 cm therefrom. After pumping the deposition chamber to less than $1\times10^{-6}$ Torr, the substrate was heated to 250° C., and gas (1 sccm $N_2$, 5 sccm $O_2$, 5 sccm Ar) was introduced, with the high vacuum pump throttled to give 10 mTorr total gas pressure. 200 W of pulsed dc power were applied to the $Ta_{0.9}Al_{0.1}$ gun, at 112 kHz, with 83% duty cycle. These conditions were maintained for 5 minutes. After turning off the power and allowing the sample to cool below 60° C., the sample was removed from the deposition chamber. Capacitance measurements were made substantially as described above. The dielectric layer had approximate composition $Ta_{1.85}Al_{0.15}O_{4.84}N_{0.1}Ar_{0.06}$, and a figure of merit ($Y_{3.0}$) substantially as shown in FIG. 5.

The invention claimed is:

1. Article comprising a capacitor comprising two electrically conductive members, and a first dielectric layer therebetween;

CHARACTERIZED IN THAT the first dielectric layer consists essentially of tantalum (Ta), aluminum (Al), oxygen (O) and nitrogen (N).

2. Article according to claim 1, wherein the first dielectric layer has composition $Ta_{1-y}Al_yO_xN_z$, where $0.05 \leq y \leq 0.5$, $2.0 \leq x \leq 2.5$, and $0 \leq z \leq 0.1$.

3. Article according to claim 2, wherein y is about 0.1, x is about 2.4 and z is about 0.02.

4. Article according to claim 1, wherein the article is a Si integrated circuit.

5. Article according to claim 1, wherein the capacitor is a member of a multi-capacitor sample, at least 75% of the members of the sample being capable of storing 3 $\mu$coulomb/cm$^2$ or more.

6. Article according to claim 1, wherein the capacitor further comprises at least one layer of a second dielectric material of composition different from the first dielectric layer.

* * * * *